US009228726B2

(12) United States Patent
Chen et al.

(10) Patent No.: US 9,228,726 B2
(45) Date of Patent: Jan. 5, 2016

(54) GLOBULAR ILLUMINANT DEVICE

(71) Applicant: Lediamond Opto Corporation, New Taipei (TW)

(72) Inventors: Peng-Yu Chen, New Taipei (TW); Chung-Ting Tseng, New Taipei (TW)

(73) Assignee: LEDIAMOND OPTO CORPORATION, New Taipei (TW)

( * ) Notice: Subject to any disclaimer, the term of this patent is extended or adjusted under 35 U.S.C. 154(b) by 42 days.

(21) Appl. No.: 14/079,417

(22) Filed: Nov. 13, 2013

(65) Prior Publication Data

US 2015/0131278 A1    May 14, 2015

(51) Int. Cl.
*F21S 13/10* (2006.01)
*F21V 19/00* (2006.01)
*F21K 99/00* (2010.01)
*H01L 25/075* (2006.01)
*F21Y 101/02* (2006.01)
*H01L 33/62* (2010.01)
*H01L 33/50* (2010.01)
*H01L 33/52* (2010.01)
*H01L 33/58* (2010.01)

(52) U.S. Cl.
CPC ............... *F21V 19/002* (2013.01); *F21K 9/30* (2013.01); *F21K 9/56* (2013.01); *H01L 25/0753* (2013.01); *F21Y 2101/02* (2013.01); *H01L 33/50* (2013.01); *H01L 33/507* (2013.01); *H01L 33/52* (2013.01); *H01L 33/58* (2013.01); *H01L 33/62* (2013.01); *H01L 2224/48091* (2013.01); *H01L 2224/48137* (2013.01); *H01L 2224/48227* (2013.01); *H01L 2224/73265* (2013.01)

(58) Field of Classification Search
CPC ......... F21V 19/002; F21V 3/00; F21V 15/01; F21V 3/02; F21K 9/30; F21K 9/56; F21K 9/135
USPC ............................ 362/227, 235, 249.02, 363
See application file for complete search history.

(56) References Cited

U.S. PATENT DOCUMENTS

2011/0286200 A1* 11/2011 Iimura et al. .................... 362/84
2012/0162998 A1*  6/2012 Takahashi ................ F21V 3/00
                                                                    362/363

FOREIGN PATENT DOCUMENTS

| TW | 200805701 A | 1/2008 |
| TW | 200929516 A | 7/2009 |
| TW | 2010032316 A | 9/2010 |

* cited by examiner

*Primary Examiner* — Evan Dzierzynski
*Assistant Examiner* — Meghan Ulanday
(74) *Attorney, Agent, or Firm* — Muncy, Geissler, Olds & Lowe, P.C.

(57) ABSTRACT

A globular illuminant device includes a hemispherical carrier, a circuit layer, a plurality of LED dies, an enclosure resin, and a hemispherical cover. The hemispherical carrier includes a carrying surface, a first cambered surface, and a first protrusion including a first surface. The circuit layer is placed on the first surface and the carrying surface. The LED dies are electrically connected to the circuit layer. The enclosure resin covers the LED dies. The hemispherical cover includes a joining surface, a second cambered surface, and a recess formed on the joining surface and concave toward second cambered surface. The hemispherical cover is assembled with the hemispherical carrier such that the joining surface is in contacted with the carrying surface while the LED dies and the enclosure resin are disposed within the recess.

13 Claims, 10 Drawing Sheets

GLOBULAR ILLUMINANT DEVICE

BACKGROUND OF THE INVENTION

1. Field of the Invention

The present invention relates to an illuminant device, and in particular to a globular illuminant device.

2. Description of Related Art

A light emitting diode (LED) is a kind of semiconductor device, which exploits the property of direct-bandgap semiconductor material to convert electric energy into light energy efficiently and has the advantages of long service time, high stability and low power consumption and is developed to replace the traditional non-directivity light tube and incandescent lamp.

The LED is a point-like light source and has high directivity so that the lighting surface of the LED is narrower than that of the traditional light sources, and the luminous intensity of the LED is gradually reduced while the lighting distance is increased, so that the LED is more suitable for providing short-distance and small area lighting fixture, such as table lamp.

In order to solve the mentioned problem, many manufacturers assemble and arrange multiple LEDs to centralize light for solving the problem of narrow angular lighting range. However, the required power for driving the LEDs is increased when the number of the LEDs is increased, therefore, the effect of saving energy cannot be achieved. Moreover, the price of LED lamp is far higher than the traditional light source so as to reduce the will of using LED lamp.

SUMMARY OF THE INVENTION

It is an object to provide a globular illuminant device assembled by hemispherical carrier and hemispherical cover, and light emitting diode (LED) dies are placed within a spherical transparent body assembled by the hemispherical carrier and the hemispherical cover to provide an omnidirectional lighting effect.

Accordingly, the globular illuminant device according to one aspect of the present invention comprises a hemispherical carrier, a circuit layer, a plurality of light emitting diode (LED) dies, an enclosure resin, and a hemispherical cover. The hemispherical carrier comprises a carrying surface, a first cambered surface connected to the carrying surface, and a first protrusive portion formed on an intersection of the carrying surface and the first cambered surface, the first protrusive port comprises a first surface, the first surface and the carrying surface are at the same horizontal level. The circuit layer is placed on the first surface and the carrying surface. The LED dies are electrically connected to the circuit layer. The enclosure resin covers the LED dies. The hemispherical cover comprises a joining surface, a second cambered surface connected to the joining surface, and a recess formed on the joining surface and concave toward the second cambered surface. The hemispherical carrier is assembled with the hemispherical cover such that the joining surface is in contacted with the carrying surface while the LED dies are accommodated within the recess of the hemispherical cover.

In an embodiment of the present invention, the globular illuminant device further comprises a phosphor layer covering the first cambered surface and the second cambered surface.

In an embodiment of the present invention, the globular illuminant device further comprises a phosphor-material located within the enclosure resin.

In an embodiment of the present invention, the LED dies are placed on the carrying surface.

In an embodiment of the present invention, the globular illuminant device further comprises a transparent substrate disposed within a groove formed on the carrying surface and concave toward the first cambered surface, the LED dies are placed on the transparent substrate and the enclosure resin covers the transparent substrate.

In an embodiment of the present invention, the LED dies are arranged in a matrix manner.

In an embodiment of the present invention, the hemispherical cover further comprises a second protrusive portion formed on an intersection of the joining surface and the second cambered surface, the second protrusive portion comprises a second surface, the circuit layer is placed on the second surface.

In an embodiment of the present invention, the globular illuminant device further comprises two transparent substrates respectively disposed within a groove formed on the carrying surface and concave toward the first cambered surface, the LED dies are respectively placed on the transparent substrate and electrically connected to the circuit layer placed on the first surface and the second surface, the enclosure resin covers the transparent substrates.

In an embodiment of the present invention, each transparent substrate comprises a planar surface, the planar surface of one of the transparent surfaces faces the first cambered surface, and the planar surface of the other transparent substrate faces the second cambered surface, the LED dies are respectively placed on the planar surface.

In an embodiment of the present invention, the globular illuminant device further comprises a plurality of wires electrically connected to the LED dies and the circuit layer.

Accordingly, the globular illuminant device according to another aspect of the present invention comprises a transparent substrate, a circuit layer, a plurality of LED dies, an enclosure resin, a hemispherical carrier, and a hemispherical cover. The transparent substrate comprises a first planar surface and a second planar surface opposite to the first planar surface. The circuit layer is placed on the first planar surface. The LED dies are placed on the first planar surface and electrically connected to the circuit layer. The enclosure resin covers the LED dies. The hemispherical carrier comprises a carrying surface and a first cambered surface connected to the carrying surface, the hemispherical carrier is assembled with the transparent substrate such that the carrying surface is in contacted with the second planar surface. The hemispherical cover comprises a joining surface, a second cambered surface, and a recess formed on the joining surface and concave toward the second cambered surface, the hemispherical cover is assembled with the transparent substrate such that the joining surface is in contacted with the first planar surface while the LED dies are accommodated within the recess.

In an embodiment of the present invention, an area of the first planar surface is larger than an area of the joining surface.

In an embodiment of the present invention, the globular illuminant device further comprises a plurality of wires electrically connected to the LED dies and the circuit layer.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
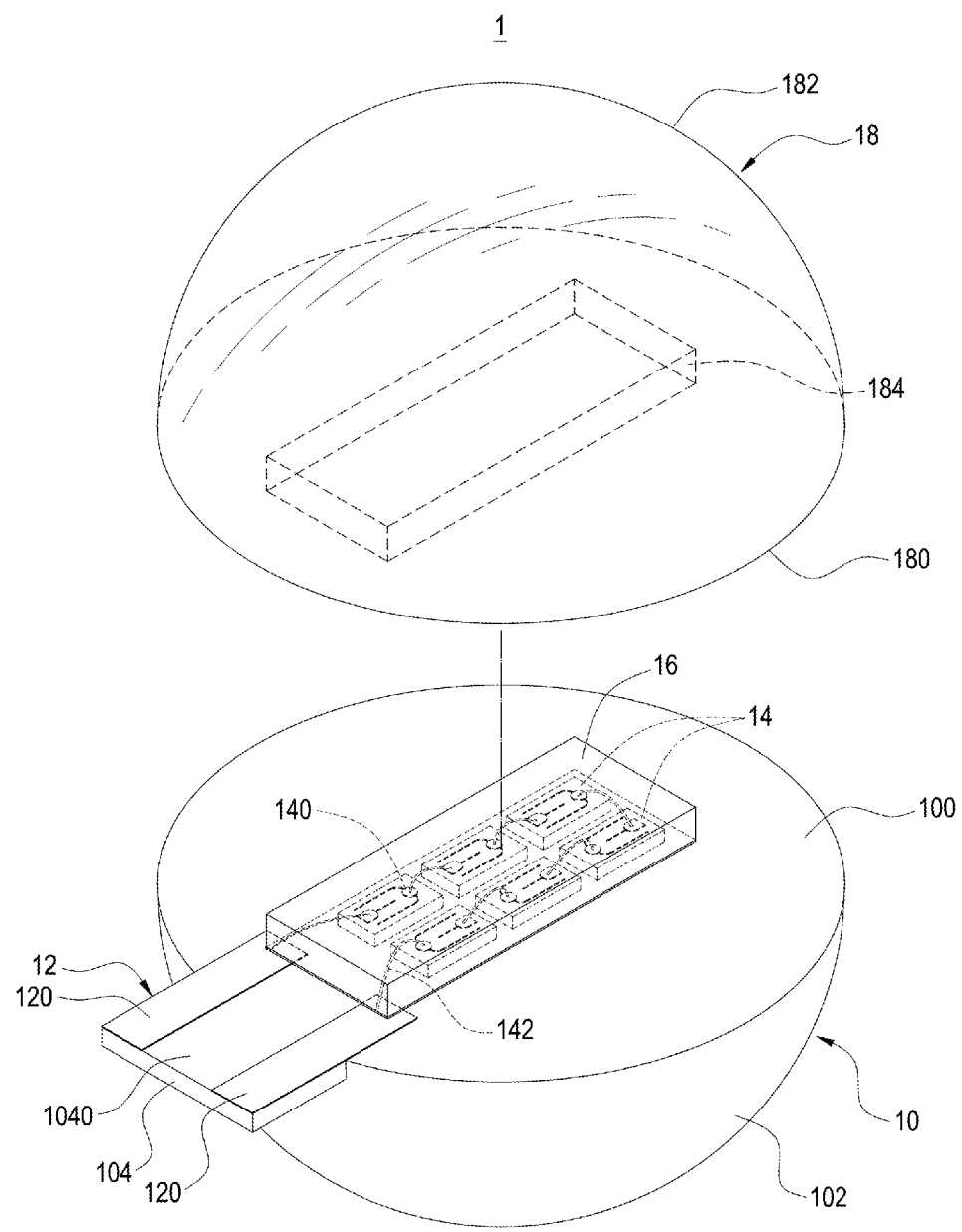
FIG. 1 is an exploded view of a globular illuminant device according to a first embodiment of the present invention.
Figure 2:
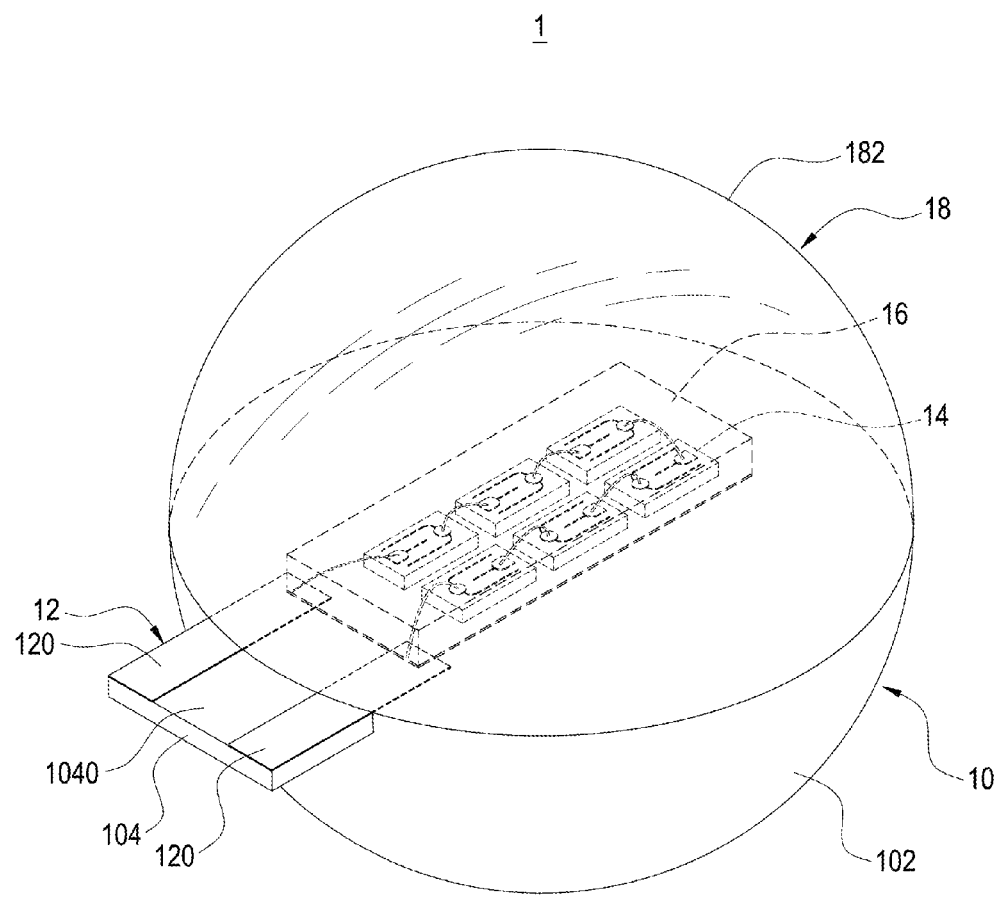
FIG. 2 is an assembled view of the globular illuminant device according to the first embodiment of the present invention.
Figure 3:
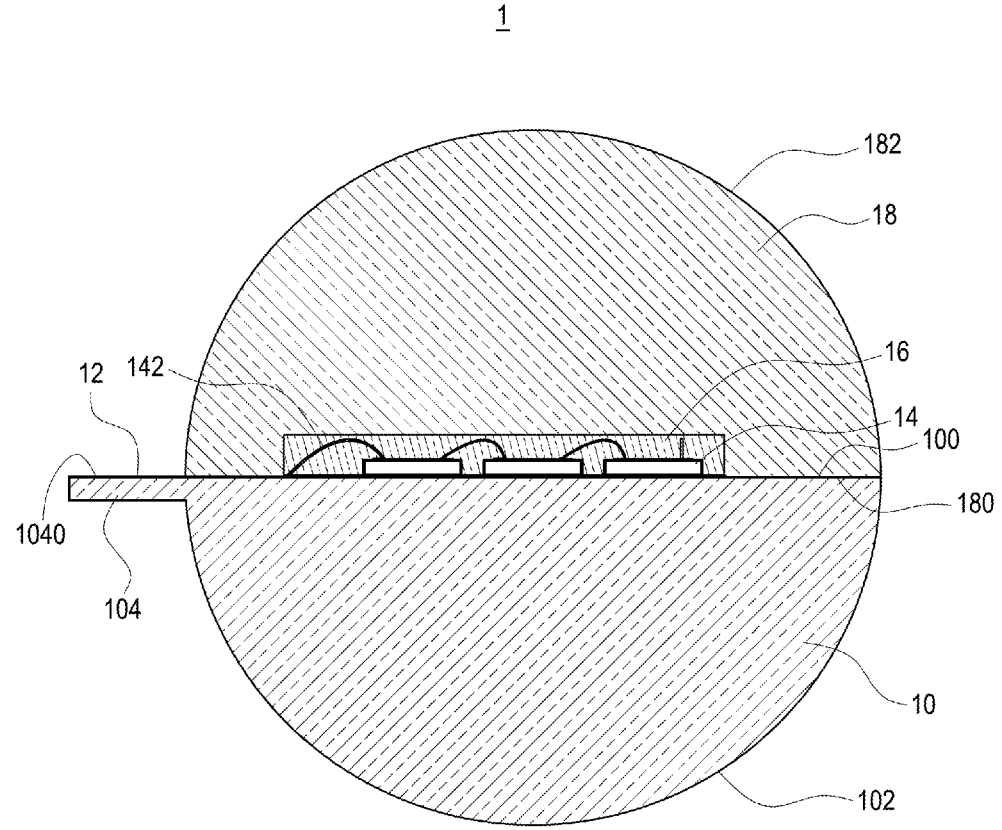
FIG. 3 is a sectional view of the globular illuminant device according to the first embodiment of the present invention.

Reference is made to FIG. 1. FIG. 2, and FIG. 3, FIG. 1 is an exploded view of a globular illuminant device according to a first embodiment of the present invention, FIG. 2 is an assembled view of the globular illuminant device according to the first embodiment of the present invention, and FIG. 3 is a sectional view of the globular illuminant device according to the first embodiment of the present invention. The globular illuminant device 1 has a spherical profile for providing a light source with omnidirectional illumination. The globular illuminant device 1 includes a hemispherical carrier 10, a circuit layer 12, a plurality of light emitting diode (LED) dies 14, an enclosure resin 16, and a hemispherical cover 18.

The hemispherical carrier 10 includes a carrying surface 100, a first cambered surface 102 connected to the carrying surface 100, and a first protrusion portion 104 formed on an intersection of the carrying surface 100 and the cambered surface 102. The first protrusion portion 104 includes a first surface 1040, the first surface 1040 and the carrying surface 100 are at the same horizontal level. In this embodiment, the hemispherical carrier 10 is made of transparent material, such as glass or quartz glass, allowing light emitted from the LED dies 14 transmitting therethrough.

The circuit layer 12 is placed on the first surface 1040 and the carrying surface 100 for conducting electric power. The circuit layer 12 is, for example, made of copper or other material with electrical conductivity. In this embodiment, the circuit layer 12 includes two electrically conductive plates 120 placed on the first surface 1040 and spaced with an interval.

The LED dies 14 are placed on the carrying surface 100 and electrically connected to the circuit layer 12. In this embodiment, the LED dies 14 are arranged in a matrix manner and electrically connected in series. In the practical application, the LED dies 14 can arrange in a linear or an irregular manner, and the LED dies 14 can electrically connect in parallel or series-parallel. The LED dies 14 are placed on the carrying surface 100 by die attachment technology, and then the LED dies 14 are electrically connected to the electrically conductive plates 120 by wire bonding technology or flip chip bonding technology. In this embodiment, the LED dies 14 are horizontal structure LED dies, and each LED die 140 includes two electrodes 140. One electrode 140 of the LED dies 14 close to the electrically conductive plate 120 is electrically connected to the electrically conductive plate 120 via a wire 142, and the other electrode of the LED dies 14 not close to the electrically conductive plate 120 is electrically connected to one electrode 140 of adjacent LED die 14 via another wire 142. Electrodes 140 of the other LED dies 14 are electrically connected to electrodes 140 of adjacent LED dies 14 via wires 142. Therefore, the LED dies 14 are electrically connected in series.

The enclosure resin 16 covers the LED dies 14 and the wires 142 for protecting the LED dies 14 and the wires 142, preventing the LED dies 14 and the wires 142 from moisture, and preventing the wires 142 from impacting by external force. The enclosure resin 16 is, for example, epoxy, silicone resin or other transparent resin allowing light emitted from the LED dies 14 transmitting therethrough.

The hemispherical cover 18 includes a joining surface 180, a second cambered surface 182 connected to the joining surface 180, and a recess 184 formed on the joining surface 180 and concave toward the second cambered surface 182. An area of the joining surface 180 is the same as an area of the carrying surface 100. The hemispherical cover 18 is assembled with the hemispherical carrier such that the joining surface 180 is in contact with the carrying surface 100, and the LED dies 14, the wires 142, and the enclosure resin 16 are accommodated within the recess 184. The hemispherical cover 18 is made of transparent material, such as glass or quartz glass, allowing light emitted from the LED dies 14 transmitting therethrough.

To sum up, the LED dies 14 of the globular illuminant device 1 according to the first embodiment of the present invention are located within a transparent sphere assembled by the hemispherical carrier 10 and the hemispherical cover 18, such that an omnidirectional lighting is provided while the first cambered surface 102 and the second cambered surface 182 can adjust light distribution of the globular illuminant device.

Figure 4:
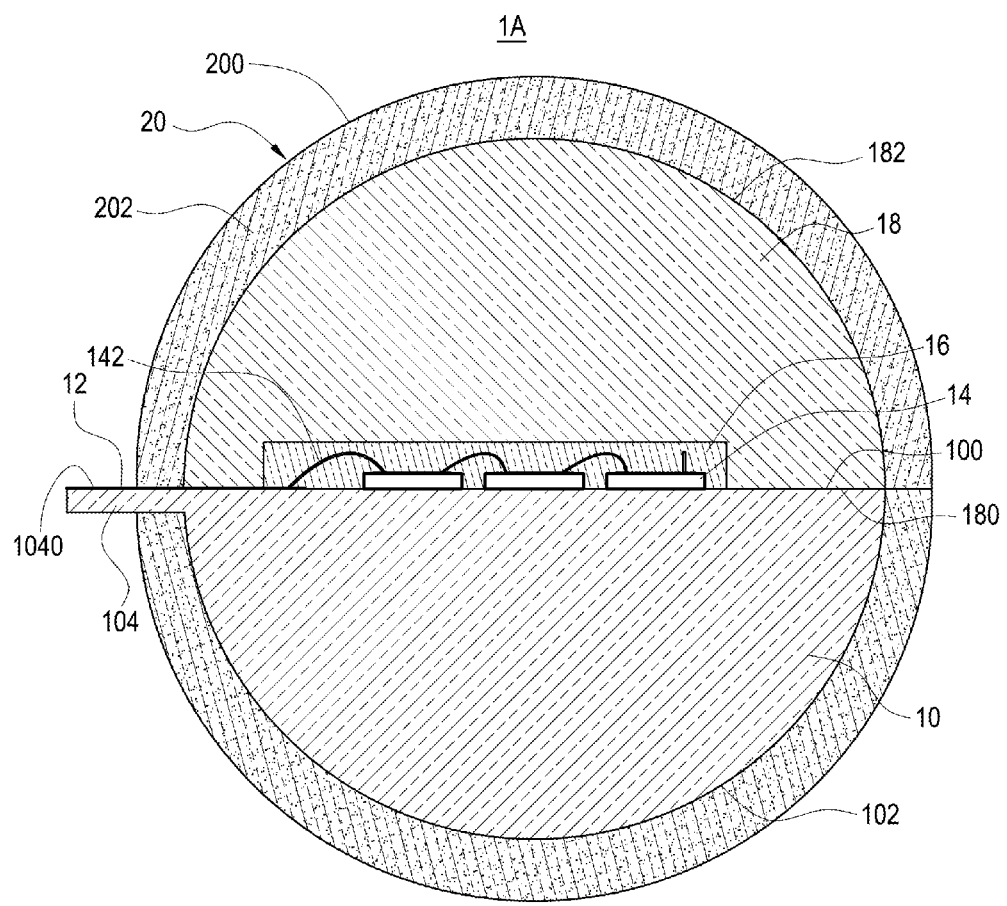
FIG. 4 is a sectional view of a globular illuminant device according to a second embodiment of the present invention.

Reference is made to FIG. 4, which is a sectional view of a globular illuminant device according to a second embodiment of the present invention. The globular illuminant device 1A is similar to the globular illuminant device 1 mentioned in the first embodiment, and the same reference numbers are used in the drawings and the description to refer to the same parts. It should be noted that the globular illuminant device 1A further includes a phosphor layer 20.

The phosphor 20 covers the first cambered surface 102 and the second cambered surface 182. The phosphor layer 20 includes a transparent resin 200 and a phosphor material 202 disposed within the transparent resin 200. The phosphor material 202 is excited by partial light emitted from the LED dies 14 and then converts the light into a wavelength-converted light, which is to be mixed with the other light emitted from the LED dies 14 to generate a light with demand color. The function and relative description of other components of the globular illuminant device 1A are the same as that of first embodiment mentioned above and are not repeated here for brevity, and the globular illuminant device 1A can achieve the functions as the globular illuminant device 1 does.

Figure 5:
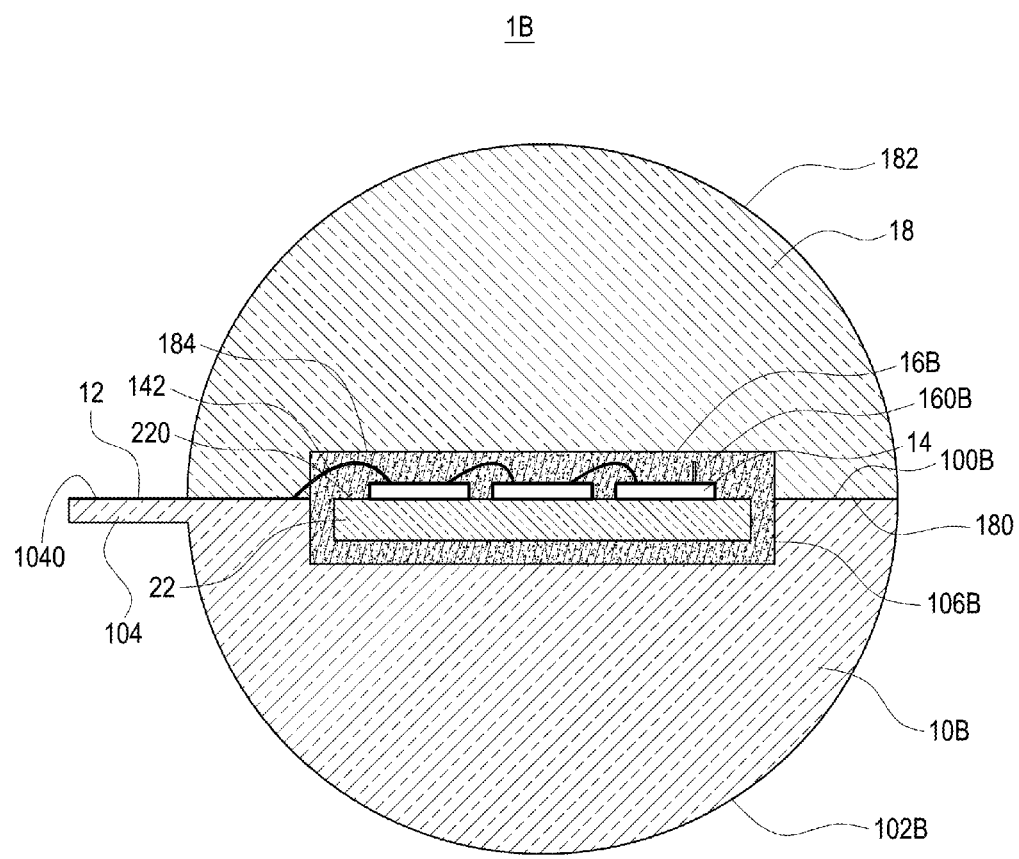
FIG. 5 is a sectional view of a globular illuminant device according to a third embodiment of the present invention.

Reference is made to FIG. 5, which is a sectional view of a globular illuminant device according to a third embodiment of the present invention. The globular illuminant device 1B is similar to the globular illuminant device 1 mentioned in the first embodiment, and the same reference numbers are used in the drawings and the description to refer to the same parts. It should be noted that the globular illuminant device 1B further includes a transparent substrate 22, and a groove 106B is formed on the hemispherical carrier 10B.

The groove 106B is formed on the carrying surface 100B and concave toward the first cambered surface 102B. The transparent substrate 22 is disposed within the groove 106B. The transparent substrate 22 is, for example, made of glass or quartz glass for allowing light emitted from the LED dies 14 transmitting therethrough. The transparent substrate 22 includes a planar surface 220. In this embodiment, the planar surface 220 is a plane having larger area of the transparent substrate 22. The planar surface 220 faces the second cambered surface 182, and an area of the planar surface 220 is smaller than an area of the carrying surface 100B. The LED dies 14 are arranged on the planar surface 220 of the transparent substrate 22 in a matrix manner (namely, the arrangement of the LED dies 14 in this embodiment is the same as the arrangement of LED dies 14 in the first embodiment) and electrically connected to the circuit layer 12.

Besides, the enclosure resin 16B of the globular illuminant device 1B according this embodiment of the present invention further includes a phosphor material 160B. The phosphor material 160B is excited by partial light emitted from the LED dies 14 and then converts the light into a wavelength-converted light, which is to be mixed with the other light emitted from the LED dies 14 to generate a light with demand color. The enclosure resin 16B is accommodated within the recess 184 and the groove 106B and covers the transparent substrate 22, the LED dies 14, and the wires 142. The function and relative description of other components of the globular illuminant device 1B are the same as that of first embodiment mentioned above and are not repeated here for brevity, and the globular illuminant device 1B can achieve the functions as the globular illuminant device 1 does.

Figure 6:
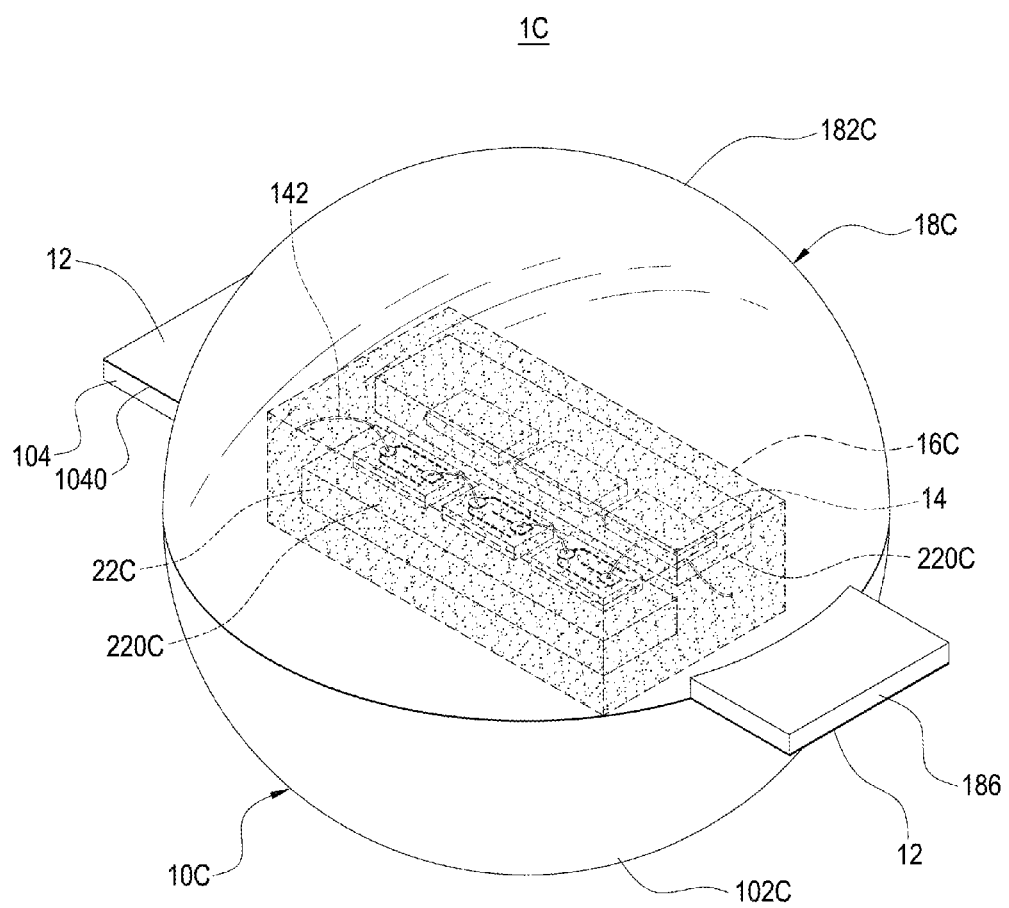
FIG. 6 is a perspective view of a globular illuminant device according to a forth embodiment of the present invention.
Figure 7:
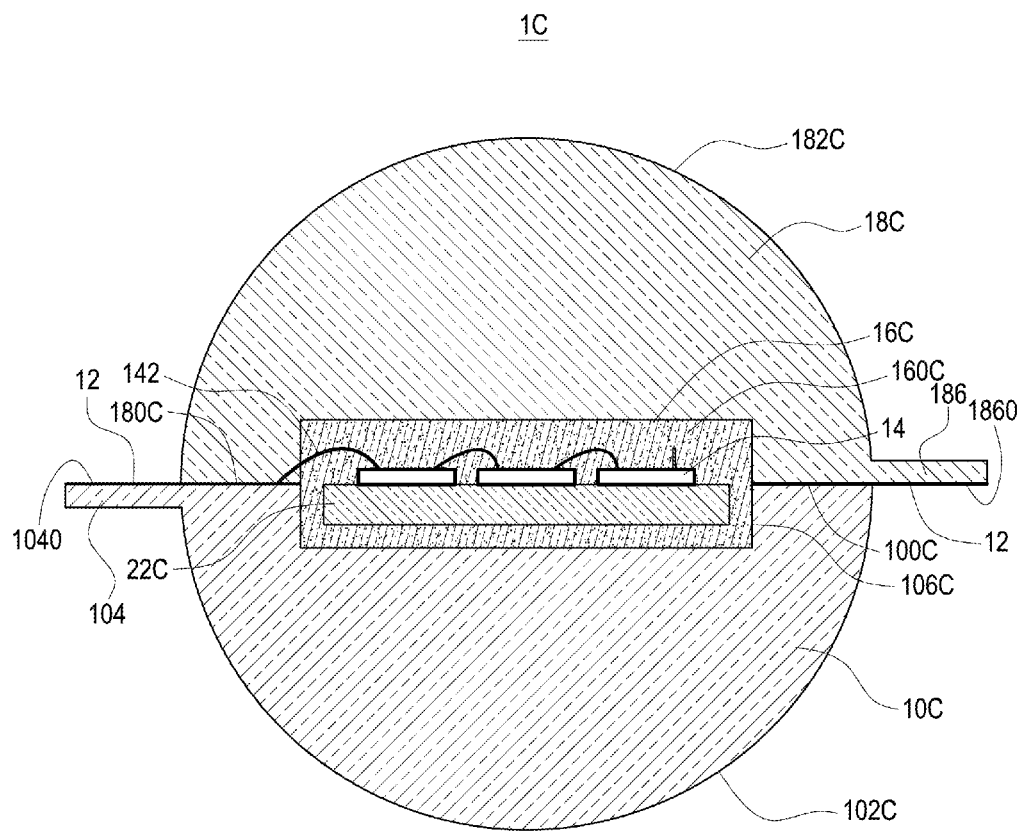
FIG. 7 is a sectional view of the globular illuminant device according the forth embodiment of the present invention.

Reference is made to FIG. 6 and FIG. 7, which are respectively a perspective view and a sectional view of a globular illuminant device according to a forth embodiment of the present invention. The globular illuminant device 1C is similar to the globular illuminant device 1 mentioned in the first embodiment, and the same reference numbers are used in the drawings and the description to refer to the same parts. It should be noted that the hemispherical cover 18C further includes a second protrusive portion 186, the hemispherical carrier 10C further includes a groove 106C, and the globular illuminant device 1C further includes two transparent substrates 22C.

The second protrusive portion 186 is formed on an intersection of the joining surface 180C and the second cambered surface 182C. The second protrusive portion 186 includes a second surface 1860, and the circuit layer 12 is placed on the second surface 1860. The groove 106C is formed on the carrying surface 100C and concave toward to first cambered surface 102C.

The transparent substrates 22C are disposed within the groove 106C and arranged in a juxtapose manner. The transparent substrate 22C is, for example, made of glass or quartz glass, for allowing light emitted from the LED dies 14 transmitting therethrough. Each transparent substrate 22C includes a planar surface 220C. In this embodiment, the planar surface 220C of one of the transparent substrates 22C faces the first cambered surface 102C, and the planar surface 220C of the other transparent substrate 22C faces the second cambered surface 182C. The LED dies 14 are placed on the planar surfaces 220C in a linear manner and electrically connected to the circuit layer 12. The LED dies 14 placed on the planar surface 220C facing the first cambered surface 102C emit light toward the first cambered surface 102C, and the LED dies 14 on the planar surface 220C facing the second cambered surface 182C emit light toward the second cambered surface 182C.

Besides, a phosphor material 160C is disposed within the enclosure resin 16C of the globular illuminant device 1C according this embodiment of the present invention. The phosphor material 160C is excited by partial light emitted from the LED dies 14 and then converts the light into a wavelength-converted light, which is to be mixed with the other light emitted from the LED dies 14 to generate a light with demand color. The enclosure resin 16C covers the transparent substrate 22C, the LED dies 14, and the wires 142. The function and relative description of other components of the globular illuminant device 1C are the same as that of first embodiment mentioned above and are not repeated here for brevity, and the globular illuminant device 1C can achieve the functions as the globular illuminant device 1 does.

Figure 8:
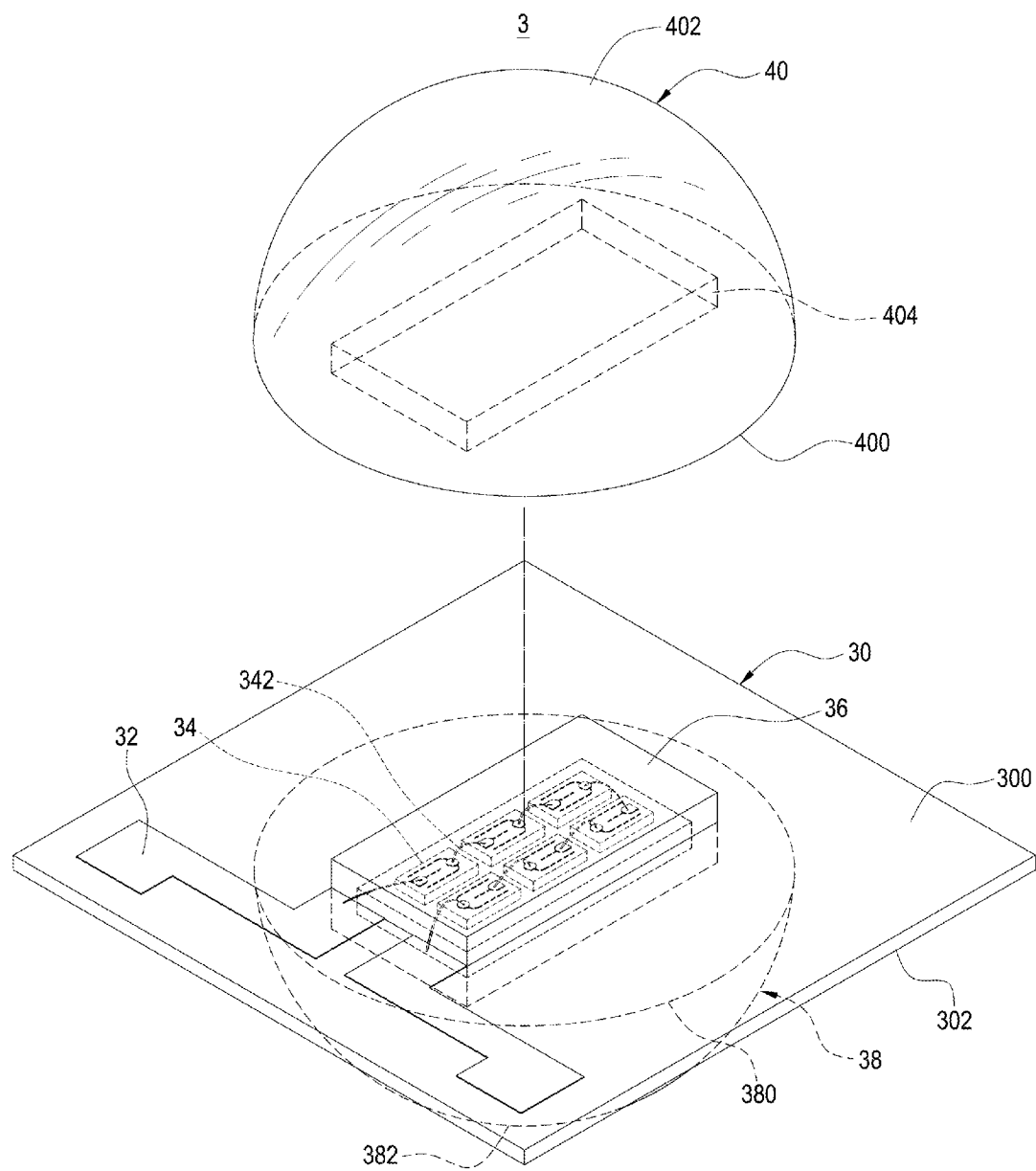
FIG. 8 is an exploded view of a globular illuminant device according to a fifth embodiment of the present invention.
Figure 9:
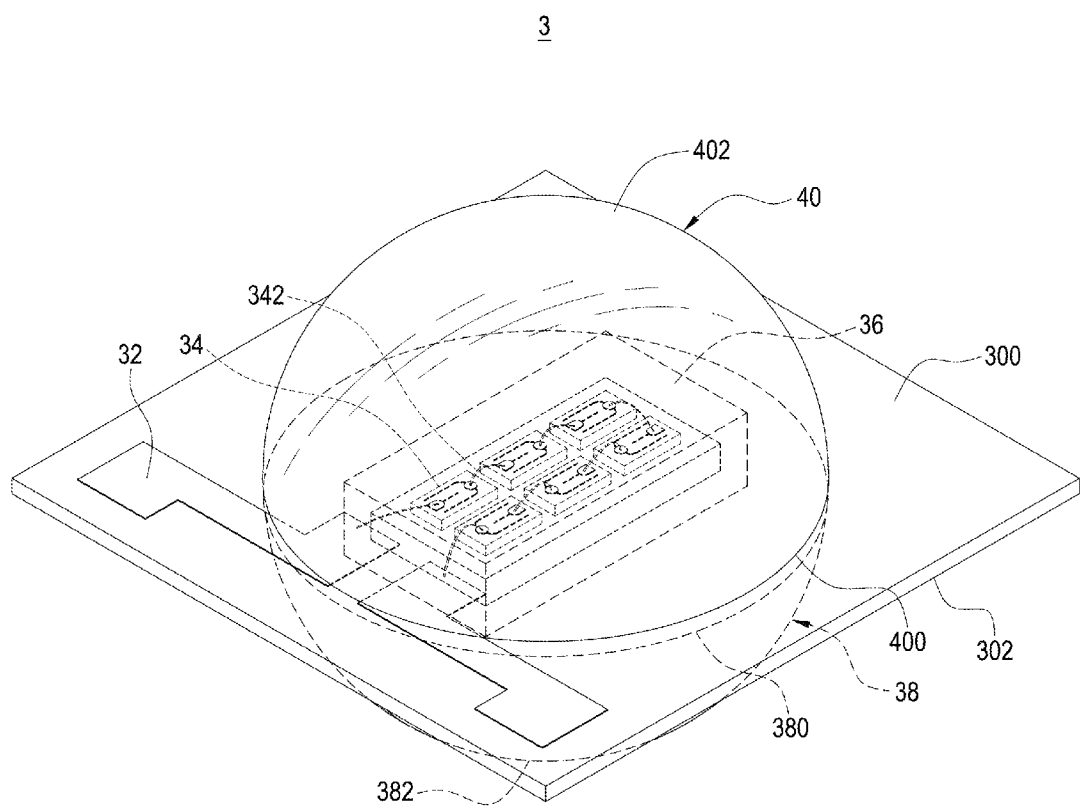
FIG. 9 is an assembled view of the globular illuminant device according to the fifth embodiment of the present invention.

Reference is made to FIG. 8 and FIG. 9, which are respectively an exploded view and an assembled view of a globular illuminant device according to a fifth embodiment of the present invention. The globular illuminant device 3 includes a transparent substrate 30, a circuit layer 32, a plurality of LED dies 34, an enclosure resin 36, a hemispherical carrier 38, and a hemispherical cover 40. The transparent substrate 30 is, for example, made of glass or quartz glass allowing light emitted from the LED dies 34 transmitting therethrough. The transparent substrate 30 includes a first planar surface 300, a second planar surface 302 opposite to the first planar surface 300. In this embodiment, the first planar surface 300 and the second planar surface 302 are plane. The first planar surface 300 and the second planar surface 302 are planes having larger area of the transparent substrate 30 on two opposite faces, and an area of the first planar surface 300 is the same as an area of the second planar surface 302. The circuit layer 32 is placed on the first planar surface 300. The circuit layer 32 is, for example, made of copper or other material having electrical conductivity.

The LED dies 34 are placed on the first planar surface 300 and electrically connected to the circuit layer 32. The LED dies 34 are placed on the first planar surface 300 by die attachment technology, and then the LED dies 34 are electrically connected to the circuit layer 32 by wire bonding technology or flip chip bonding technology. In this embodiment, the LED dies 34 are horizontal structure LED dies, and the LED dies 34 are electrically connected to the circuit layer 32 by wires 342.

The hemispherical carrier 38 includes a carrying surface 380 and a first cambered surface 382. The carrying surface 380 is a plane, and an area of the carrying surface 380 is smaller than the second planar surface 302. The hemispherical carrier 38 is, for example, made of glass or quartz glass allowing light emitted from the LED dies 34 transmitting therethrough. The hemispherical carrier 38 is assembled with the transparent substrate 30 such that the carrying surface 380 is in contact with the second planar surface 302.

The hemispherical cover 40 includes a joining surface 400, a second cambered surface 402 connected to the joining surface 400, and a recess 404 formed on the joining surface 400 and concave toward the second cambered surface 402. The joining surface 400 is a plane, and an area of the joining surface 400 is smaller than an area of the first planar surface 300, and the area of the joining surface 400 is the same as the area of the carrying surface 380. The hemispherical cover 40 is, for example, made of glass or quartz glass allowing light emitted from the LED dies 34 transmitting therethrough. The hemispherical cover 40 is assembled with the transparent substrate 30 such that the joining surface 400 is in contact with the first planar surface 300 while the LED dies 34, the wires 342, and the enclosure resin 36 are accommodated within the recess 404. In this embodiment, the hemispherical cover 40 is arranged corresponding to the hemispherical carrier 38 such that a profile of the globular illuminant device 3 is substantially spherical.

Figure 10:
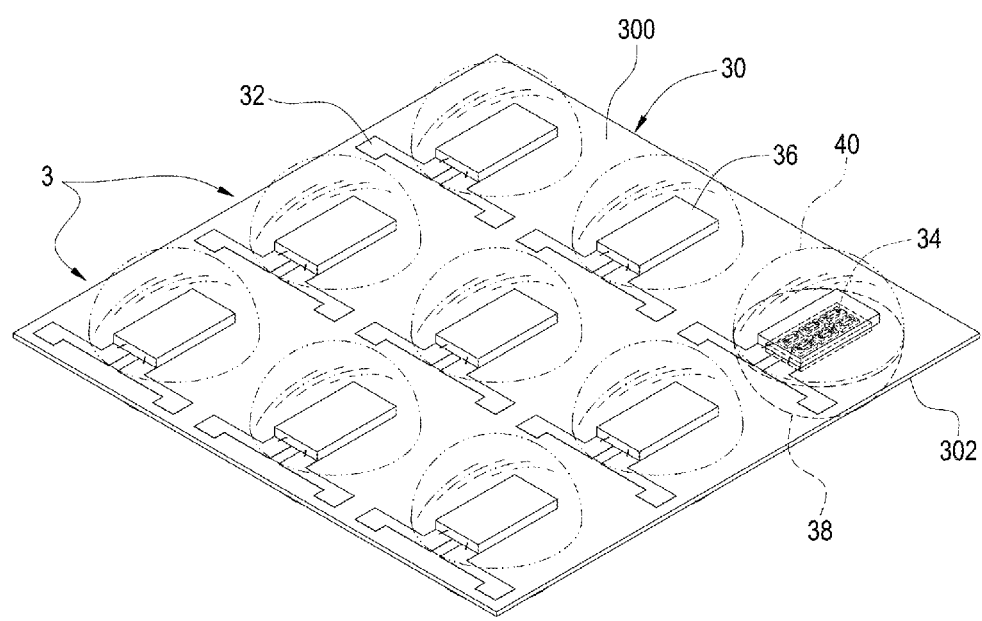
FIG. 10 is a perspective view of combined globular illuminant device according to the fifth embodiment of the present invention.

In the practical assembly, plurality groups of LED dies 34 are placed on a transparent substrate 30 with a large area. In particularly, an amount of a group of LED die 34 is the same as an amount of the LED dies 34 of the globular illuminant device 3 mentioned above). And then, the enclosure resin 36 is covered on the LED dies 34, as shown in FIG. 10. After that, the hemispherical carrier 38 and the hemispherical cover 40 are correspondingly assembled on the first planar surface 300 and the second planar surface 302 of the transparent substrate 30, therefore a plurality of globular illuminant device 3 are formed. Thereby the manufacturing processes and cost can be reduced. In the practical usage, one of more globular illuminant device 3 can be cut by demand, and the circuit layer 32 of two or more globular illuminant device 3 are electrically connected to formed globular illuminant device arranged in a linear or matric manner.

To sum up, the transparent substrate 30, the hemispherical carrier 38, and the hemispherical cover 40 of the globular illuminant device 3 are respectively made of transparent material such that partial light emitted from the LED dies 34 directly transmits through the hemispherical cover 40, and the other light emitted from the LED dies 34 transmits through the first planar surface 300 and the second planar surface 302, and transmits through and out of the hemispherical carrier 38 to provide an omnidirectional lighting effect.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A globular illuminant device comprising:
    a hemispherical carrier comprising a carrying surface, a first cambered surface connected to the carrying surface, and a first protrusive portion formed on an intersection of the carrying surface and the first cambered surface, the first protrusive portion comprising a first surface, the first surface and the carrying surface being at the same horizontal level;
    a circuit layer placed on the first surface and the carrying surface;
    a plurality of light emitting diode (LED) dies electrically connected to the circuit layer;
    an enclosure resin covering the LED dies; and
    a hemispherical cover comprising a joining surface, a second cambered surface connected to the joining surface, and a recess formed on the joining surface and concave toward the second cambered surface, wherein the hemispherical carrier is assembled with the hemispherical cover such that the joining surface is in contact with the carrying surface while the LED dies are accommodated within the recess of the hemispherical cover.

2. The globular illuminant device in claim 1, further comprising a phosphor layer covering the first cambered surface and the second cambered surface.

3. The globular illuminant device in claim 1, further comprising a phosphor material located within the enclosure resin.

4. The globular illuminant device in claim 1, wherein the LED dies are placed on the carrying surface.

5. The globular illuminant device in claim 1, further comprising a transparent substrate disposed within a groove formed on the carrying surface and concave toward the first cambered surface, the LED dies are placed on the transparent substrate and the enclosure resin covers the transparent substrate.

6. The globular illuminant device in claim 4, wherein the LED dies are arranged in a matrix manner.

7. The globular illuminant device in claim 5, wherein the LED dies are arranged in a matrix manner.

8. The globular illuminant device in claim 1, wherein the hemispherical cover further comprises a second protrusive portion formed on an intersection of the joining surface and the second cambered surface, the second protrusive portion comprises a second surface, the circuit layer is placed on the second surface.

9. The globular illuminant device in claim 8, further comprising two transparent substrates respectively disposed within a groove formed on the carrying surface and concave toward the first cambered surface, the LED dies are respectively placed on the transparent substrate and electrically connected to the circuit layer placed on the first surface and the second surface, the enclosure resin covers the transparent substrates.

10. The globular illuminant device in claim 9, wherein each transparent substrate comprises a planar surface, the planar surface of one of the transparent surfaces faces the first cambered surface, and the planar surface of the other transparent substrate faces the second cambered surface, the LED dies are respectively placed on the planar surface.

11. The globular illuminant device in claim 1, further comprising a plurality of wires electrically connected to the LED dies and the circuit layer.

12. A globular illuminant device comprising:
    a transparent substrate comprising a first planar surface and a second planar surface opposite to the first planar surface;
    a circuit layer placed on the first planar surface;
    a plurality of LED dies placed on the first planar surface and electrically connected to the circuit layer;
    an enclosure resin covering the LED dies;
    a hemispherical carrier comprising a carrying surface and a cambered surface connected to the carrying surface, the hemispherical carrier assembled with the transparent substrate such that the carrying surface is in contact with the second planar surface; and
    a hemispherical cover comprising a joining surface, a second cambered surface, and a recess formed on the joining surface and concave toward the second surface, the hemispherical cover assembled with the transparent substrate such that the joining surface is in contact with the first planar surface while the LED dies are accommodated within the recess,
    wherein an area of the first planar surface is larger than an area of the joining surface.

13. The globular illuminant device in claim 12, further comprising a plurality of wires electrically connected to the LED dies and the circuit layer.

* * * * *